(12) United States Patent
Huang et al.

(10) Patent No.: US 8,438,529 B1
(45) Date of Patent: May 7, 2013

(54) COMPUTING DEVICE AND METHOD FOR CHECKING SIGNAL TRANSMISSION LINE

(75) Inventors: Ya-Ling Huang, Shenzhen (CN);
Ling-Ling Shen, Shenzhen (CN);
Chia-Nan Pai, New Taipei (TW);
Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/585,854

(22) Filed: Aug. 15, 2012

(30) Foreign Application Priority Data

Dec. 15, 2011 (CN) .......................... 2011 1 0420837

(51) Int. Cl.
*G06F 17/50* (2006.01)

(52) U.S. Cl.
USPC ........... 716/137; 716/106; 716/111; 716/112; 716/115; 716/126

(58) Field of Classification Search .................. 716/115, 716/137, 106, 111, 112, 126, 130
See application file for complete search history.

(56) References Cited

U.S. PATENT DOCUMENTS

| | | | |
|---|---|---|---|
| 6,983,434 B1* | 1/2006 | Frank et al. | 716/112 |
| 2002/0073384 A1* | 6/2002 | Buffet et al. | 716/4 |
| 2004/0163056 A1* | 8/2004 | Frank et al. | 716/5 |
| 2005/0246670 A1* | 11/2005 | Bois et al. | 716/5 |
| 2005/0246672 A1* | 11/2005 | Bois et al. | 716/5 |
| 2005/0251770 A1* | 11/2005 | Frank et al. | 716/5 |
| 2007/0118823 A1* | 5/2007 | Zhao et al. | 716/5 |
| 2008/0134124 A1* | 6/2008 | Kato et al. | 716/16 |

* cited by examiner

*Primary Examiner* — Nha Nguyen
(74) *Attorney, Agent, or Firm* — Altis Law Group, Inc.

(57) ABSTRACT

A computer-based method and a computing device for checking signal transmission lines of a printed circuit board (PCB) layout are provided. The computing device identifies differential pairs in a currently run PCB layout according to an information file for the currently run PCB layout, checks whether any signal transmission line is routed between switching vias of each differential pair according to the information file for the currently run PCB layout, and displays a routing error window to display information of each misrouted signal transmission line.

2 Claims, 4 Drawing Sheets

COMPUTING DEVICE AND METHOD FOR CHECKING SIGNAL TRANSMISSION LINE

BACKGROUND

1. Technical Field

Embodiments of the present disclosure relates to circuit simulating systems and methods, and more particularly, to a computing device and a method for checking whether any signal transmission line is routed between switching vias of a differential pair in a printed circuit board (PCB) layout.

2. Description of Related Art

Routing any signal transmission line between switching vias of a differential pair in a PCB layout has an undesirable impact on signal integrity. Therefore, it is necessary to ensure that no signal line is thus routed. However, checking whether any signal line is misrouted are often done visually by a technician, which is not only time-consuming, but also error-prone.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
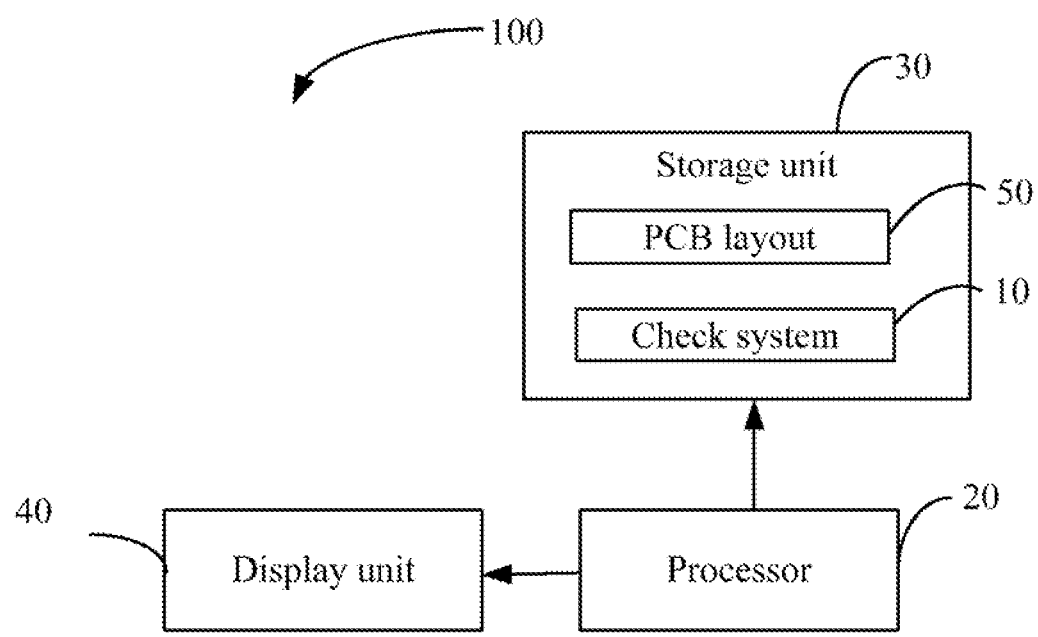
FIG. 1 is a block diagram of one embodiment of a computing device for checking signal transmission lines of a PCB layout.

FIG. 1 is a block diagram of one embodiment of a computing device 10. The computing device 10 includes a processor 20, a storage unit 30, and a display unit 40. The storage unit 30 may be a computer, a smart media card, a secure digital card, or a flash card. The storage unit 30 stores computerized codes of a check system 10, at least one PCB layout 50, and an information file for each PCB layout 50. Each information file includes information for defining types of signal transmission lines, information for determining which via each signal transmission line is connected to, and information for determining whether any transmission line is routed between vias. The check system 10 includes various software components and/or set of instructions, which may be implemented by the processor 20 to check whether any signal transmission line is routed between switching vias of each differential pair.

Figure 2:
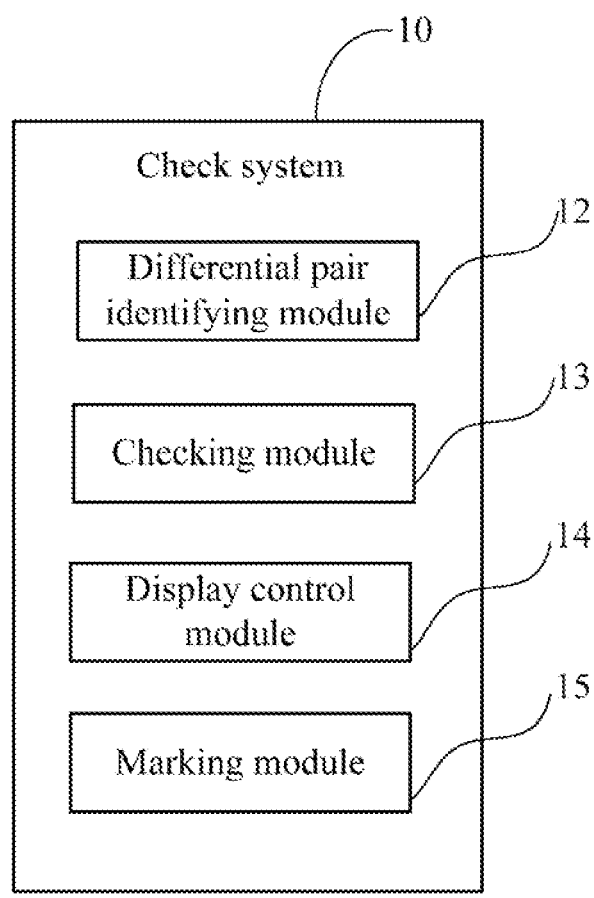
FIG. 2 is a block diagram of one embodiment of function modules of a check system in the computing device of FIG. 1.

FIG. 2 is a block diagram of the function modules of the check system 10 in the computing device 100 of FIG. 1. In one embodiment, the check system 10 includes a differential pair identifying module 12, a checking module 13, a display control module 14, and a marking module 15.

The differential pair identifying module 12 includes various software components and/or set of instructions, which may be implemented by the processor 20 to identify differential pairs in one currently run PCB layout 50 according to the types of signal transmission lines defined in the information file for the currently run PCB layout 50.

The checking module 13 includes various software components and/or set of instructions, which may be implemented by the processor 20 to check whether any signal transmission line is routed between the switching vias of each differential pair according to the information file for the currently run PCB layout. In this embodiment, the checking module 12 is implemented by the processor 20 to identify the switching vias belonging to each differential pair according to the information for determining which via each signal transmission line is connected to, and determine whether any signal transmission line is routed between the switching vias of each differential pair according to the information for determining whether any transmission line is routed between vias.

Figure 3:
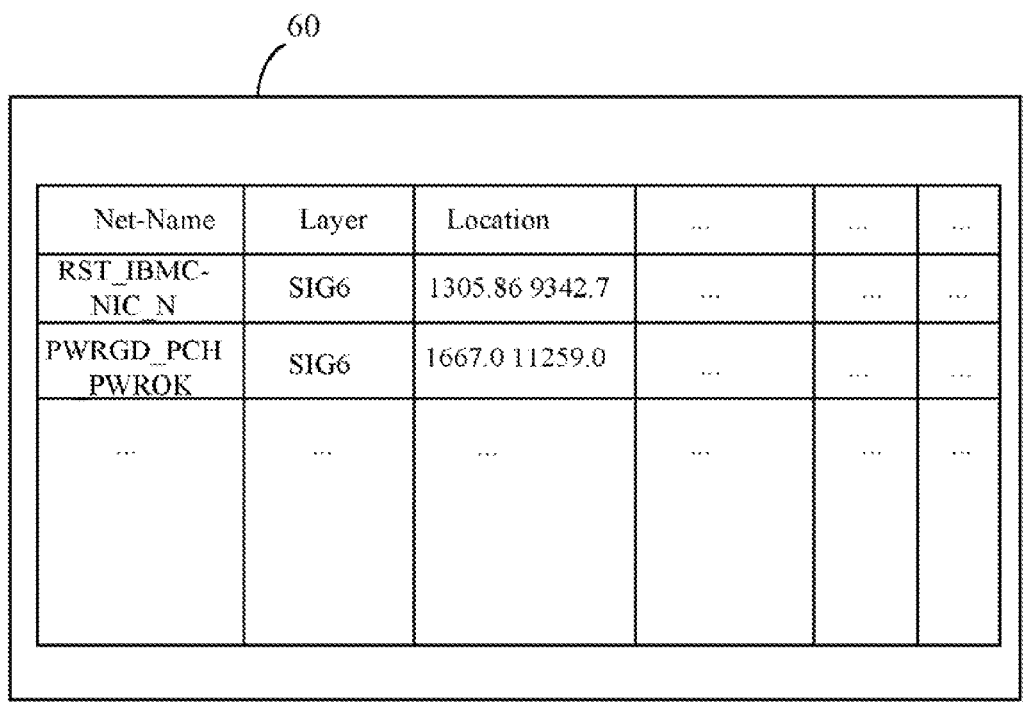
FIG. 3 is a schematic view of a routing error window provided by the check system of FIG. 2.

The display control module 14 includes various software components and/or set of instructions, which may be implemented by the processor 20 to display a routing error window 60 (see FIG. 3) on the display unit 40. The routing error window 60 displays information of each signal transmission line found to be routed between the switching vias of a differential pair. The information may include the name and the location of each misrouted signal transmission line, and the layer each misrouted signal transmission line is routed on.

The marking module 15 includes various software components and/or set of instructions, which may be implemented by the processor 20 to mark each misrouted signal transmission signal line in the currently displayed PCB layout, for example, highlight the misrouted signal transmission signal line in the currently displayed PCB layout.

Figure 4:
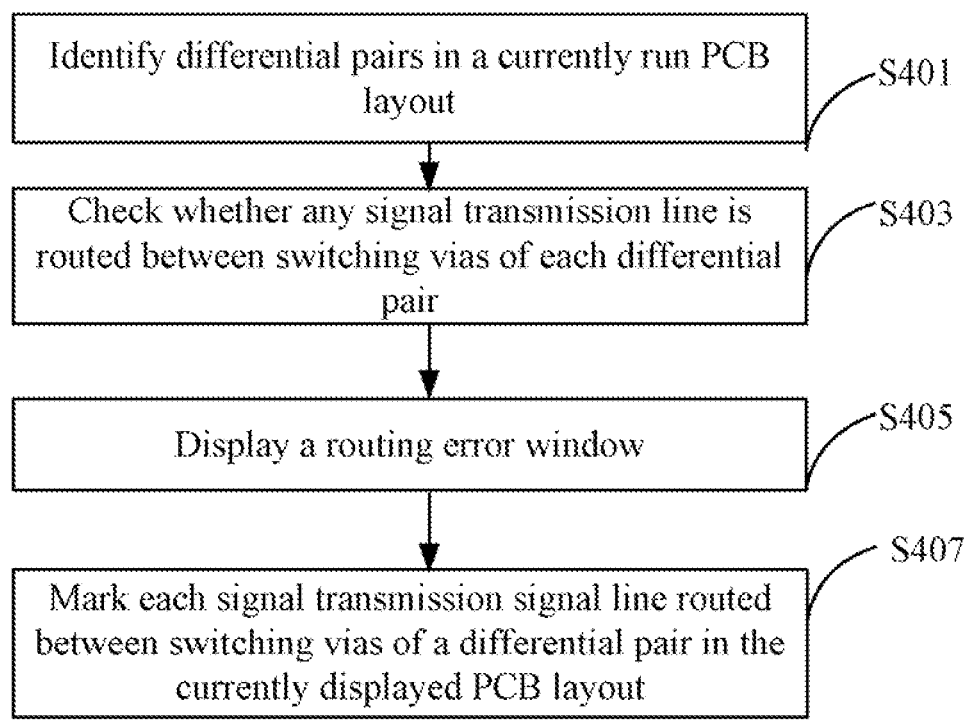
FIG. 4 is a flowchart of one embodiment of a method for checking signal transmission lines of a PCB layout.

FIG. 4 is a flowchart of one embodiment of a method for checking signal transmission lines of a PCB layout. Depending on the embodiment, additional blocks may be added, others removed, and the ordering of the blocks may be changed.

In block S401, the differential pair identifying module 12 is implemented by the processor 20 to identify differential pairs in one currently run PCB layout 50 according to the types of signal transmission lines defined in the information file for the currently run PCB layout 50.

In block S403, the checking module 13 is implemented by the processor 20 to check whether any signal transmission line is routed between the switching vias of each differential pair according to the information file for the currently run PCB layout.

In block S405, the display control module 14 is implemented by the processor 20 to display the routing error window 60 on the display unit 40.

In block S407, the marking module 15 is implemented by the processor 20 to mark each misrouted signal transmission signal line in the currently displayed PCB layout.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-based method for checking signal transmission lines of a printed circuit board (PCB) layout, the method comprising:

identifying differential pairs in a currently run PCB layout according to an information file for the currently run PCB layout by using a computer;

checking whether any signal transmission line is routed between switching vias of each of the differential pairs according to the information file for the currently run PCB layout by using the computer;
displaying a routing error window to display information of each signal transmission line routed between the switching vias of one of the differential pairs by using the computer;
marking each signal transmission line routed between the switching vias of one of the differential pairs in the currently run PCB layout by using the computer; and
wherein the information file corresponding to the currently run PCB layout comprises information for defining types of signal transmission lines, information for determining which via each signal transmission line is connected to, and information for determining whether any transmission line is routed between vias.

2. A computing device, comprising:
a storage device;
at least one processor; and
a check system comprising computerized code in the form of one or more programs, which are stored in the storage device and executable by the at least one processor, the one or more programs comprising:
a differential pair identifying module operable to identify differential pairs in a currently run printed circuit board (PCB) layout according to an information file for the currently run PCB layout;
a checking module operable to check whether any signal transmission line is routed between switching vias of each of the differential pairs according to the information file for the currently run PCB layout;
a display control module operable to display information of each signal transmission line routed between the switching vias of one of the differential pairs;
a marking module operable to mark each signal transmission line routed between the switching vias of one of the differential pairs in the currently run PCB layout; and
wherein the information file corresponding to the currently run PCB layout comprises information for defining types of signal transmission lines, information for determining which via each signal transmission line is connected to, and information for determining whether any transmission line is routed between vias.

* * * * *